(12) United States Patent
Otte et al.

(10) Patent No.: US 8,778,723 B2
(45) Date of Patent: Jul. 15, 2014

(54) SERIAL CONNECTION OF THIN-LAYER SOLAR CELLS

(75) Inventors: Karsten Otte, Leipzig (DE); Alexander Braun, Markkleeberg (DE); Steffen Ragnow, Leipzig (DE); Andreas Rahm, Leipzig (DE); Christian Scheit, Leipzig (DE)

(73) Assignee: Solarion AG Photovoltaik, Leipzig (DE)

( * ) Notice: Subject to any disclaimer, the term of this patent is extended or adjusted under 35 U.S.C. 154(b) by 131 days.

(21) Appl. No.: 13/496,779

(22) PCT Filed: Sep. 17, 2010

(86) PCT No.: PCT/EP2010/005718
§ 371 (c)(1),
(2), (4) Date: Jul. 16, 2012

(87) PCT Pub. No.: WO2011/032717
PCT Pub. Date: Mar. 24, 2011

(65) Prior Publication Data
US 2012/0276681 A1    Nov. 1, 2012

(30) Foreign Application Priority Data
Sep. 20, 2009   (DE) .................. 10 2009 041 905

(51) Int. Cl.
*H01L 31/042* (2014.01)

(52) U.S. Cl.
USPC ....... 438/80; 257/E27.125; 438/462; 438/940

(58) Field of Classification Search
USPC ............... 257/E27.125; 438/80, 462, 940
See application file for complete search history.

(56) References Cited

U.S. PATENT DOCUMENTS

| | | | |
|---|---|---|---|
| 5,593,901 A | 1/1997 | Oswald et al. | |
| 6,541,693 B2 * | 4/2003 | Takada et al. | 136/244 |
| 8,319,097 B2 * | 11/2012 | Luch | 136/256 |
| 2009/0000108 A1 | 1/2009 | Manz | |
| 2010/0015752 A1 * | 1/2010 | Brabec et al. | 438/73 |

FOREIGN PATENT DOCUMENTS

| | | |
|---|---|---|
| EP | 1727211 A1 | 11/2006 |
| EP | 1 918 993 A1 | 5/2008 |
| JP | 2004 260013 A | 9/2004 |
| WO | WO-2008/157807 A2 | 12/2008 |
| WO | WO-2009/067526 A2 | 5/2009 |

OTHER PUBLICATIONS

International Search Report (in German with English translation) for PCT/EP2010/005718, mailed Dec. 19, 2011; ISA/EP.

* cited by examiner

*Primary Examiner* — John C Ingham
(74) *Attorney, Agent, or Firm* — Harness, Dickey & Pierce, P.L.C.

(57) ABSTRACT

The invention relates to a serial connection of thin layer solar cells. The invention provides a structuring method for creating a reliable and effective connections, preventing short-circuits and enlarging usable solar cell surfaces. The solar cells comprise a substrate, a back contact layer, an absorber layer, a buffer layer, and a transparent front contact layer. Each solar cell is subdivided by three trenches A, B, C to create a plurality of adjacent cell segments. Trenches A and B extend down to the back contact layer, trench C extends down to the substrate. Trench C is filled with electrically insulating paste and trench B is filled with electrically conducting paste. The electrically conducting paste also covers trench C. The adjacent cell segments are electrically connected. Trench A is then created and filled with electrically insulating paste.

13 Claims, 10 Drawing Sheets

Invention-specific structure of the joint.

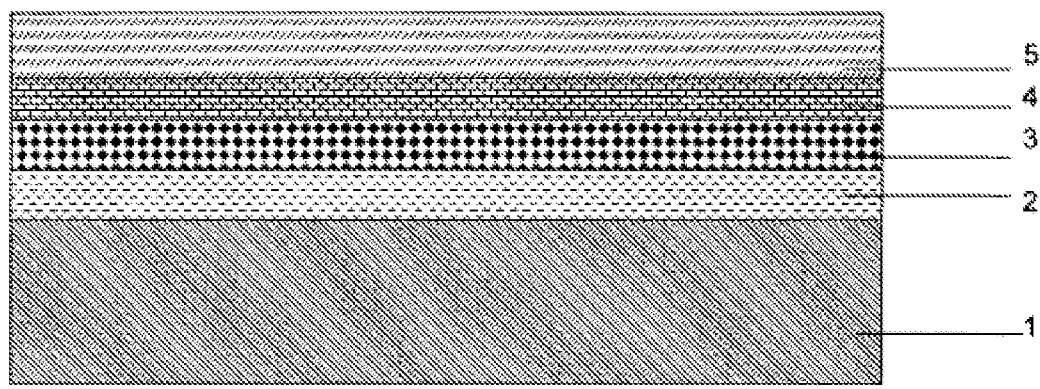
Figure 1: Structure of a CIGS thin-layer solar cell.
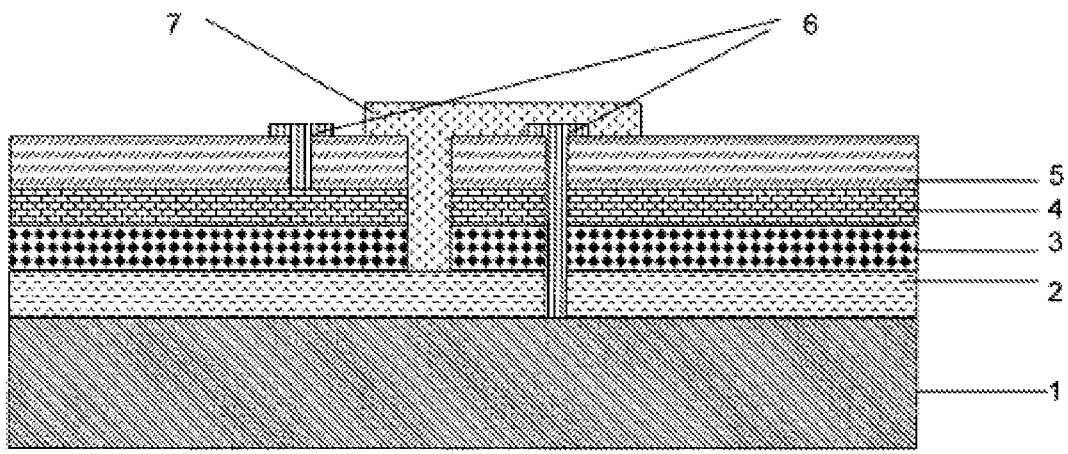
Figure 2: Prior art

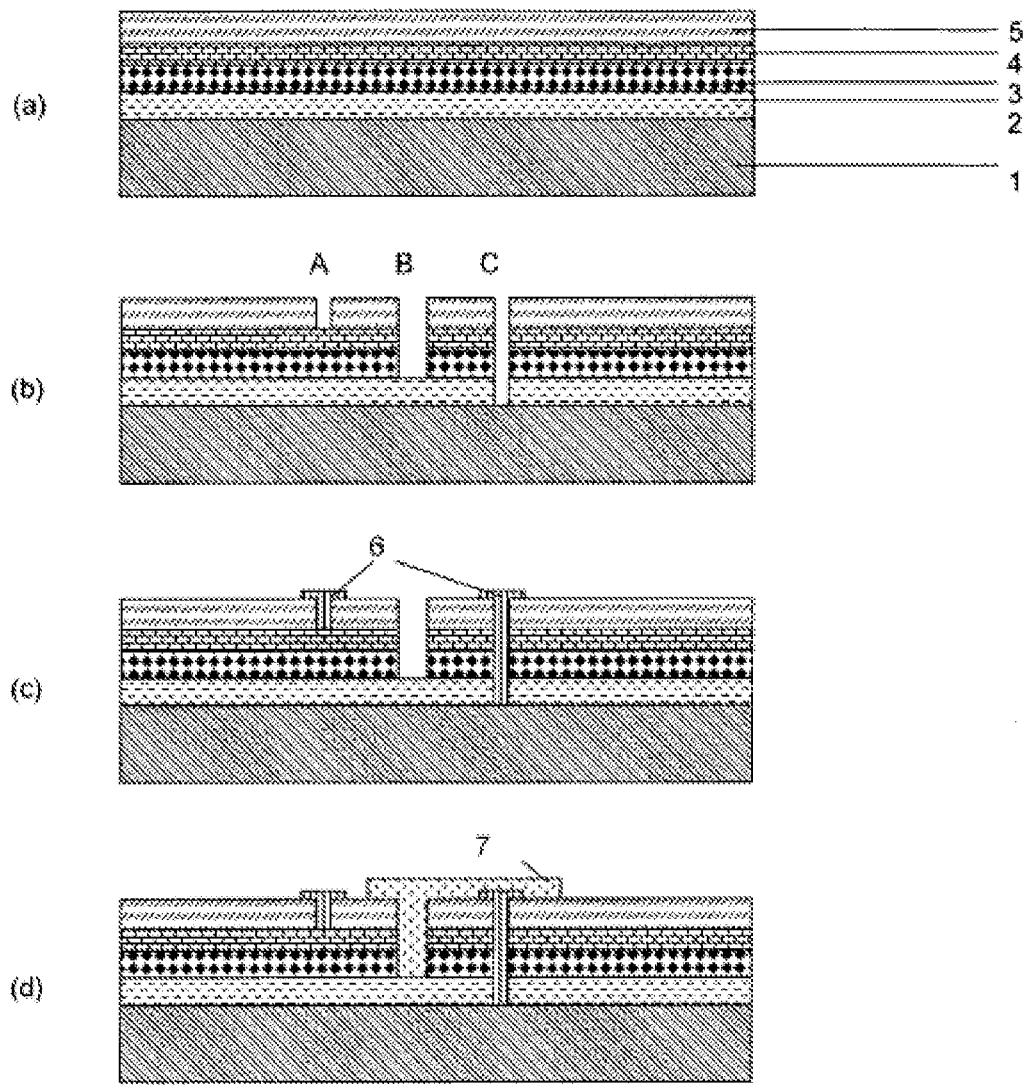
Figure 3: Process sequence in the prior art

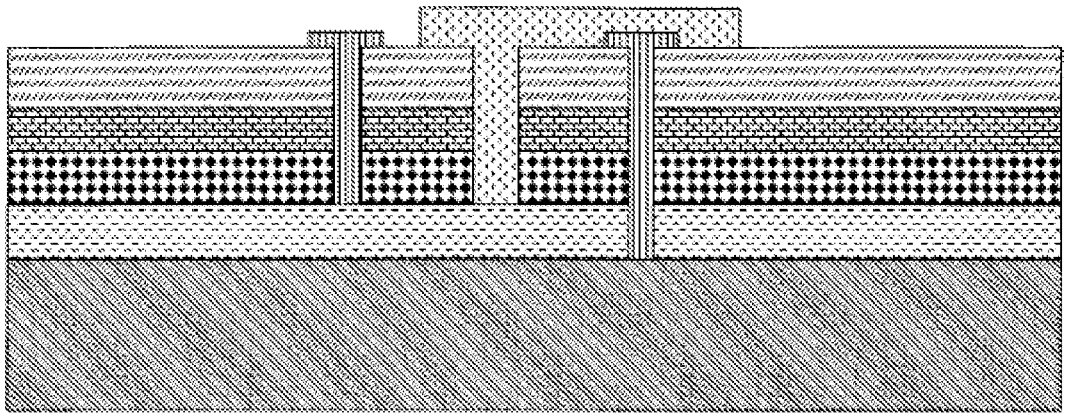

Figure 4: Invention-specific structure of the joint.

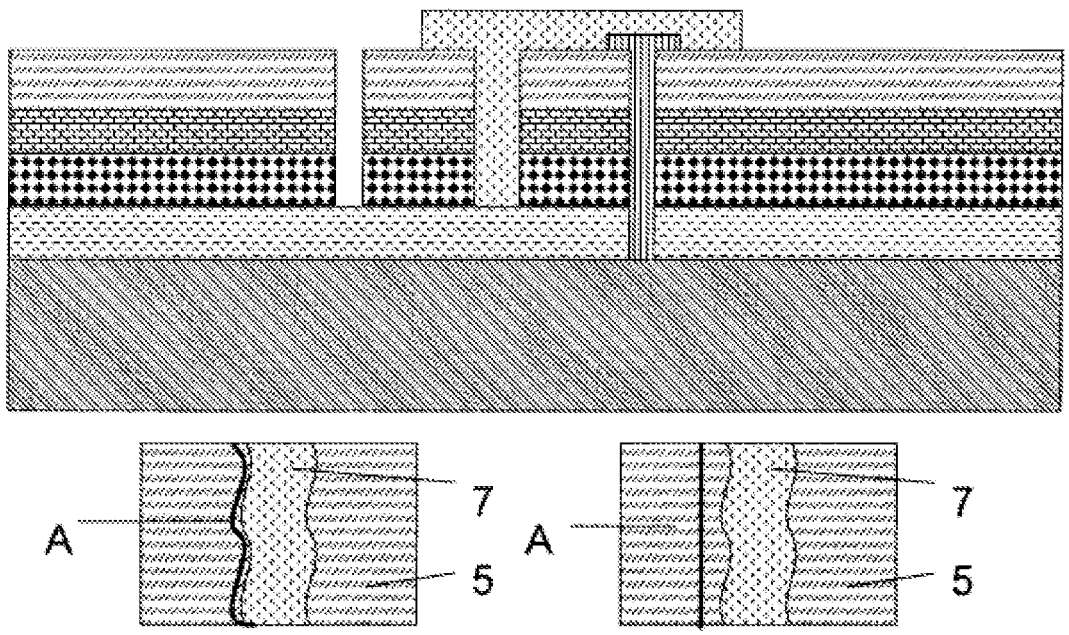

Figure 5: Alternative to the invention-specific connection. Top: side view,
Lower left: adaptation of the surface treatment A to the uneven edge of filling from electrically conduction paste.
Lower right: Depiction of the position of surface treatment A to the edge of the filling from electrically conducting paste.

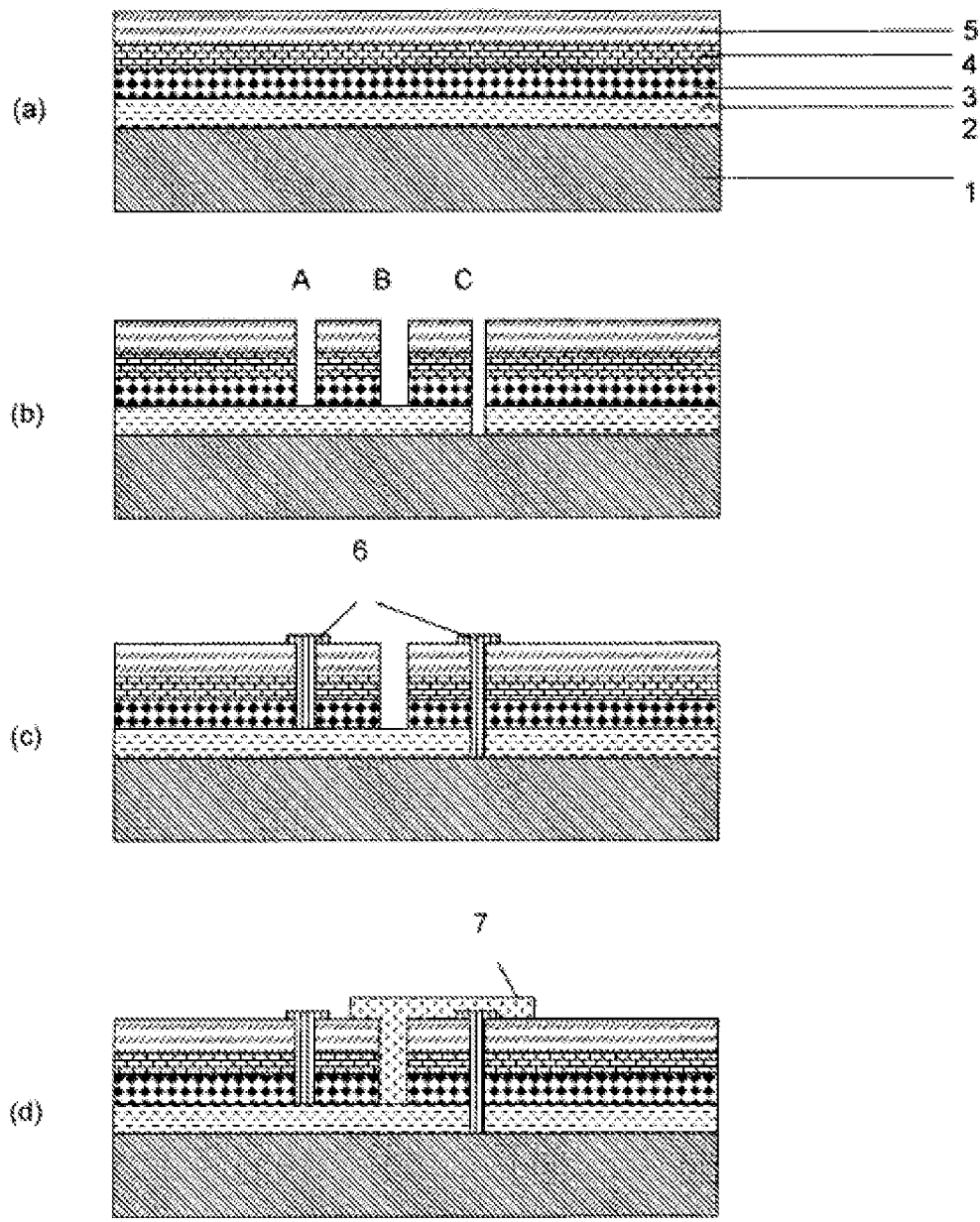
Figure 6: Invention-specific process sequence for Aspect A.

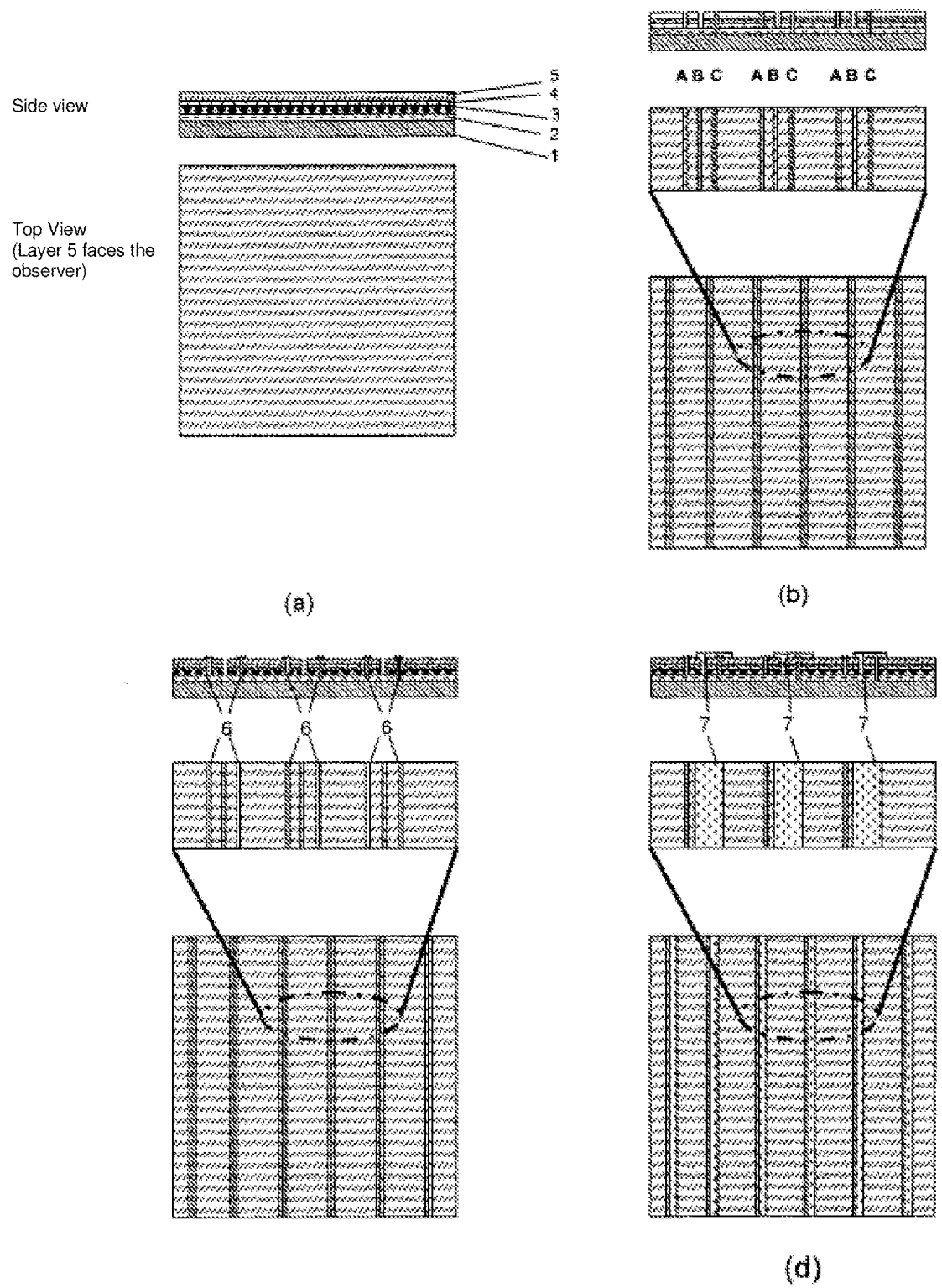
Figure 7: Illustration for example of process sequence for Aspect A.

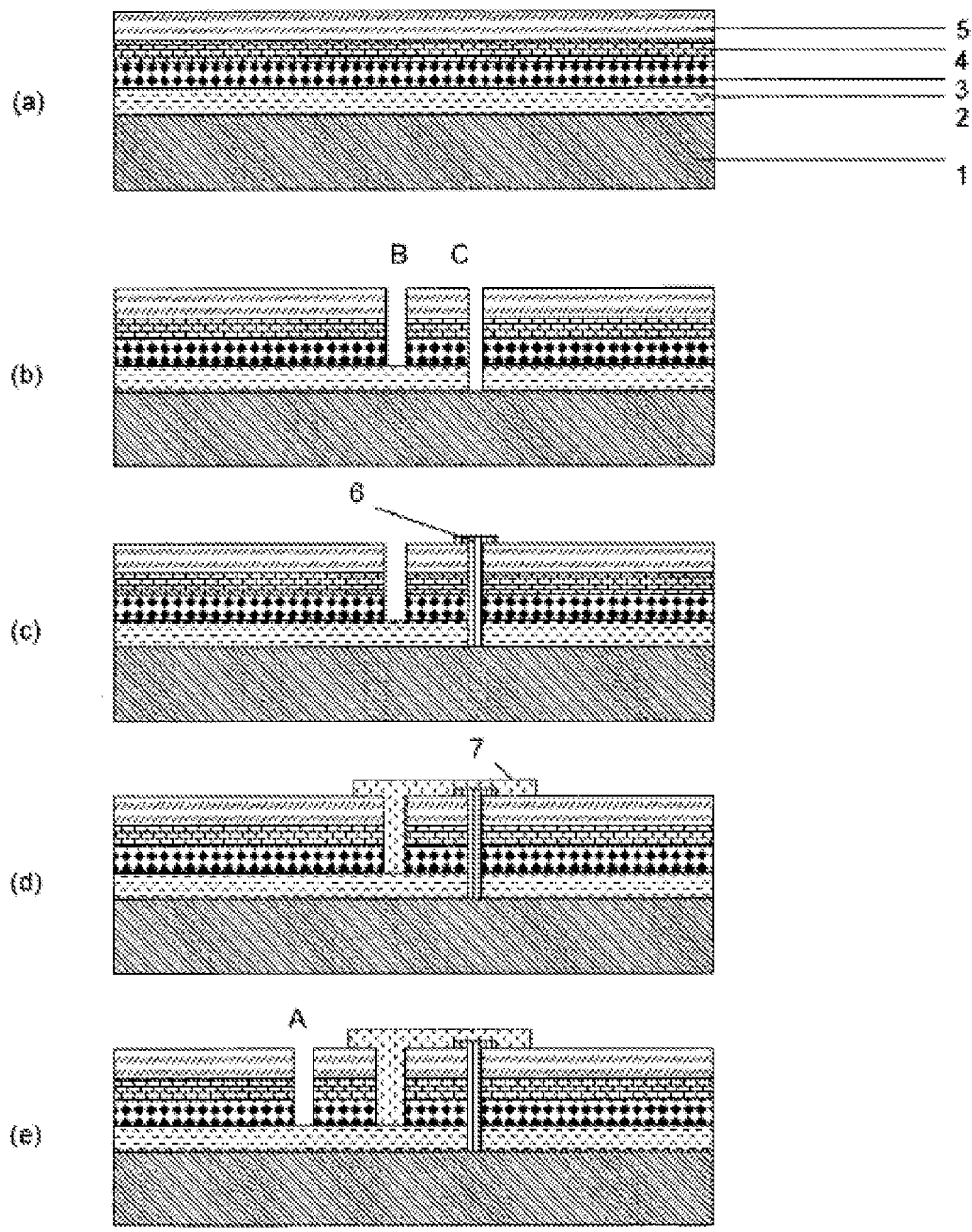
Figure 8: Invention-specific process sequence for Aspect B.

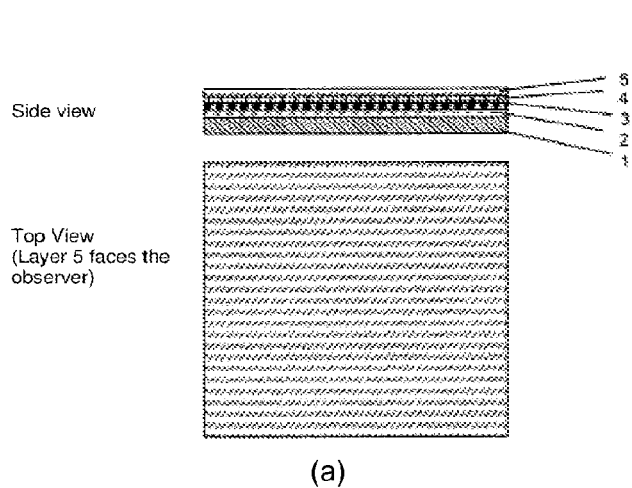
(a)
Figure 9(a): Illustration for example of process sequence for Aspect A.
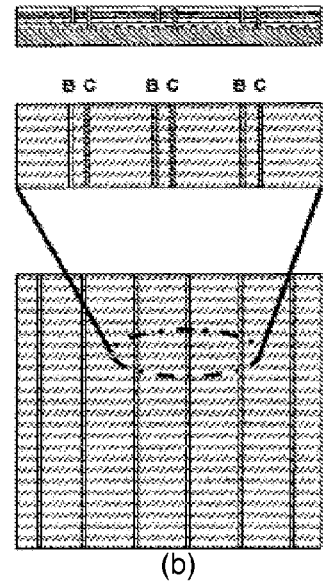
(b)
Figure 9(b): Illustration for example of process sequence for Aspect A.
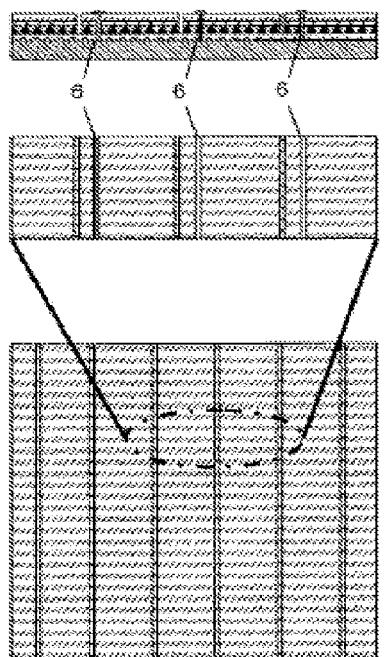
(c)
Figure 9(c): Illustration for example of process sequence for Aspect A.
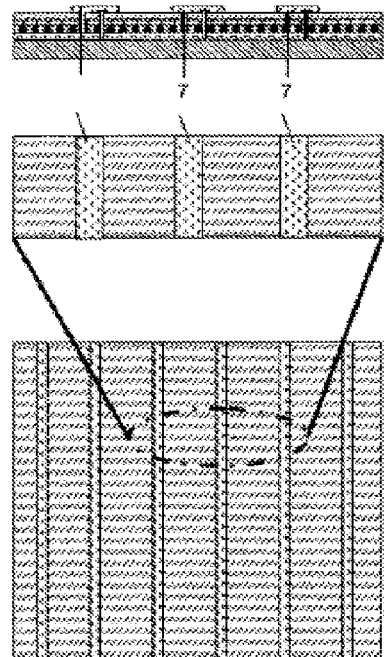
(d)
Figure 9(d): Illustration for example of process sequence for Aspect A.

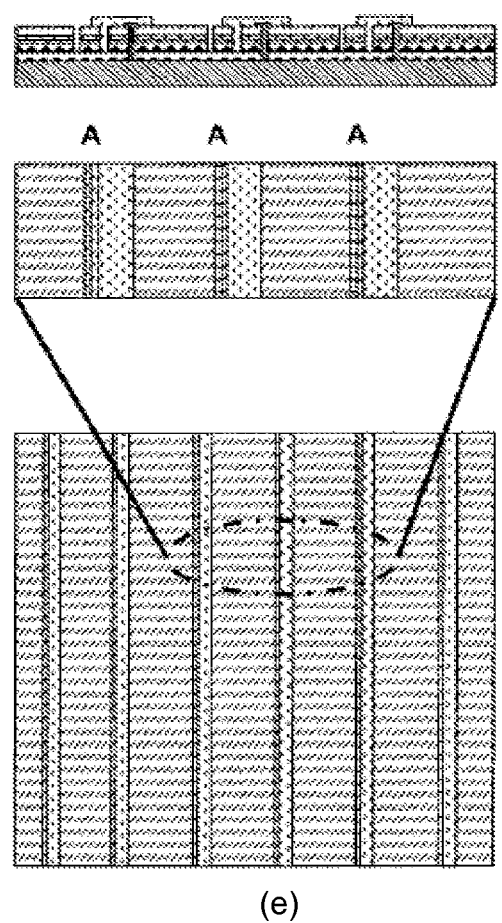
Figure 9(e): Illustration for example of process sequence for Aspect A.

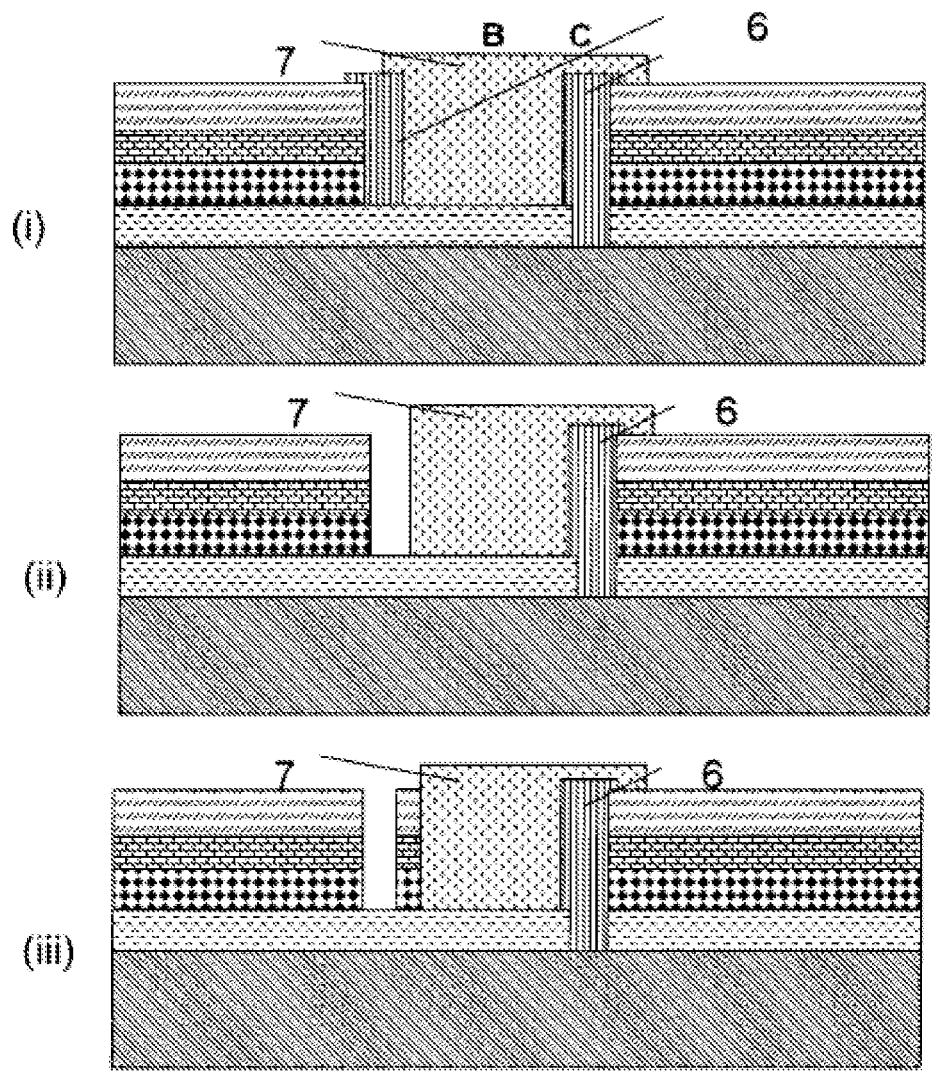
Figure 10: Alternative to the invention-specific connection.

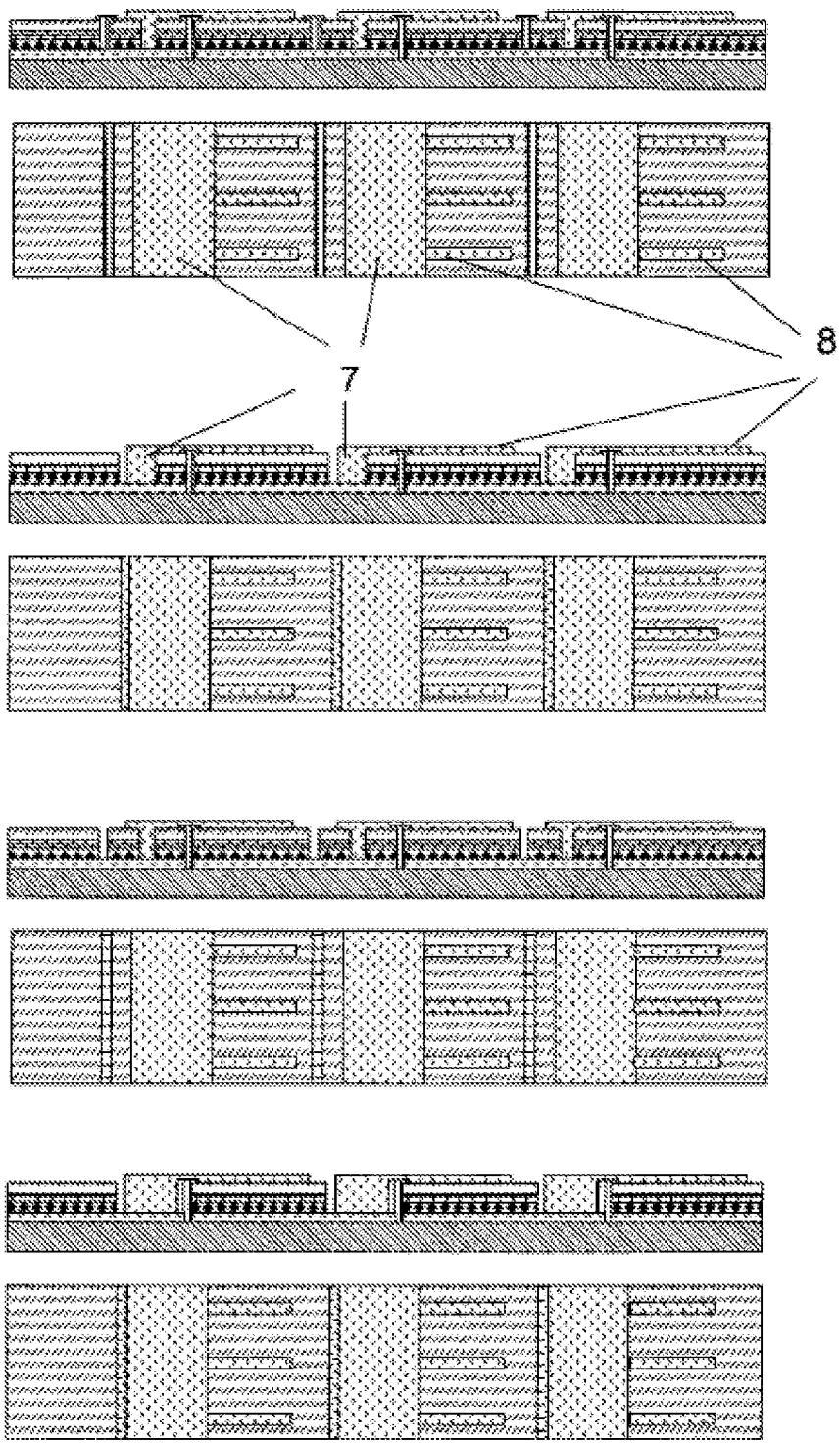
Figure 11: Alternative to the invention-specific structure by additional application of electrically conducting contact fingers.

SERIAL CONNECTION OF THIN-LAYER SOLAR CELLS

CROSS-REFERENCE TO RELATED APPLICATIONS

This application is a National State application of PCT international application PCT/EP2010/005718, filed on Sep. 17, 2010, and claims priority to German patent application No. 10 2009 041 905.5, filed on Sep. 20, 2009. The contents of both applications are incorporated by reference in their entirety.

FIELD

The invention relates to serial connection of thin-layer solar cells for manufacture of solar modules.

BACKGROUND

The manufacture of thin-layer solar cells with varied structure is already known. They can be deposited on rigid carriers such as glass, but also onto foils, i.e. thin, flexible metallic or polymeric carriers. The basic structure of a thin-layer solar cell is depicted in FIG. 1 using a CIGS thin-layer solar cell on a foil base and includes the carrier or substrate which for example consists of a foil (1), the back contact layer (2), which in essence comprises a molybdenum layer in the example, the absorber layer made for example of CIGS (3), a buffer layer made for example of cadmium sulfide (4), a tunnel contact made for example of intrinsic zinc oxide and the transparent front-side electrode, which consists of a transparent oxide conductor as for example indium tin oxide (ITO) or aluminum-doped zinc oxide. The tunnel contact and the front-side electrode (also designated as a transparent front contact layer) are jointly depicted as a layer (5). It is advantageous for manufacture of thin-layer solar cells to continuously run the process during layer deposition.

Achievement of serial connection of thin-layer solar cells in the form of a monolithic integration is also known. The procedures for this are found, for example, in U.S. Pat. No. 5,593,901. As described with the building up of thin-layer solar cells and their connection, for a monolithically integrated connection, alternating coating and surface-treatment steps must be carried out. Deposition of the individual layers of the thin-layer solar cell is thus interrupted by multiple surface-treatment steps.

To avoid an interruption of the deposition processes, it was suggested in WO 2008/157807 A2 to carry out all the surface-treatment steps after manufacture of the complete layer package, and to fill them with electrically conducting polymeric paste or electrically insulated polymeric paste (FIG. 2). FIG. 3 shows the process sequence based on prior art. The point of departure is the layer package depicted in FIG. 3 (a) of substrate (1), rear contact layer (2), photoactive layer (3), buffer layers (4) and transparent front contact layer (5). This layer package is now surface-treated, as shown in FIG. 3 (b), and subdivided into individual segments. Any number of individual segments can initially be chosen. For each individual segment, 3 surface-treatment steps are needed. The individual surface-treatment steps are explained in what follows with the aid of FIG. 3 (b). Surface treatment A completely splits up the transparent front contact layer (5), so that the buffer layers (4) and the absorber layer (3) become visible. Surface treatment B splits up all layers above the back contact layer (2) and thus reveals them. With surface treatment C, the complete layer package, including the back contact layer above the substrate is split up. To achieve a series connection between the individual segments defined by the surface treatment, a connection from the back contact layer of a segment to the front contact layer of a following segment must be achieved. As per the prior art, this connection is generated by means of an electrically conducting polymeric paste, which is filled into the surface-treated trench B (see FIG. 3 (d)). The surface treatment A serves to prevent a short circuit of the individual segments adjoining the front contact layers. Surface treatment C assumes this task, albeit for the individual segments adjoining the back contact layers. Surface treatments A and C are filled with an electrically insulating polymeric paste (see FIG. 3 (c)).

The known technical solutions have a number of drawbacks which can be subdivided into two aspects.

SUMMARY

Aspect A

All of the surface treatments (A, B and C) shown in FIG. 3 (b) are made at differing depths of the layer package—surface-treatment step A down to the buffer layer, surface-treatment step B down to the back contact layer, and surface-treatment step C down to the substrate. For each of the surface-treatment steps thus either a separate set of parameters must be found for complete removal of the corresponding layers without doing damage to the layers lying beneath, or an additional technology must be used. Since different layer sequences must be divided in the surface treatments A, B and C, thus 3 parameter sets or up to 3 different technologies are necessary. If the surface is to be mechanically treated, for example, by means of a scriber, a parameter set can for example include the application power of the scriber, the traversing speed of the scriber, the radius of the scriber tip and the number of scriber passes.

Normally the adhesion of the transparent front contact layer (5) on the buffer layers (4) or on the absorber layer (3) is higher than the adhesion of the absorber layer (3) on the back contact layer (2). Thus, technically it is very exacting for example by means of the scriber to remove the transparent front contact layer above the buffer layers.

Similarly problematical is the removal of the transparent front contact layer using laser irradiation. If, for example, a laser is used with a wavelength of 532 nm, almost no energy can be deposited in the transparent front contact layer, because at these wavelengths, as a rule the transparent front contact layers exhibit a high transmission. The majority of the energy radiated in by the laser is then deposited in the buffer layers and in the absorber layer, and there for example leads to a melting on of these layers, which is linked with a functional disruption by short circuits, for example, in these layers.

To circumvent this problem, lasers with shorter wavelengths could be selected. For example, the current transparent front contact layers show a high absorption capacity at a wavelength of 266 nm, through which the radiation emitted by this laser can be well deposited in the transparent front layer. These short wavelengths of these lasers are generated by means of frequency conversion from lasers with greater wavelengths. Such a frequency conversion presupposes cost-intensive optical devices with service lives that in part are limited. For another thing, such a frequency conversion always involves a reduction in laser intensities and thus a reduction in throughputs within the framework of mass production.

Surface treatment step A separates the front contact layers of two adjoining segments. With the prior art, the buffer and absorber layers are not split up. As a rule, absorber layers are semiconductor materials which also conduct electricity. In fact as a rule, the transverse conductivity of these semiconductor layers is markedly lower than the transverse conductivities of the transparent front contact layer and of the back contact layer, but nonetheless not vanishingly small. What adds to the difficulty is that modern absorber-semiconductor layers are increasingly produced to be low-ohmic, thus increasing their transverse conductivity. Evidently there is a false belief here that insulation is sufficient if the transparent front contact layer is split up. But it is entirely possible that despite splitting up of the transparent front contact layer, an electrical connection continues to exist between the transparent front contact layer of two adjoining individual segments via the absorber layer and the electrically conducting polymeric paste filled in the surface-treated trench B (see FIG. 3 (d)). Thus a short circuit is present and the electrical connection of individual segments in the sense of a series connection is considerably disrupted in its function.

Aspect B

In the prior art, first the layer package is surface-treated, and then, as described above, the trench generated is filled with electrically insulating and electrically conducting polymeric pastes. Both the positioning precision when applying the electrically conducting and electrically insulating polymeric pastes and also the running of these polymeric pastes after application make it necessary during surface treatment to make allowances for these aspects in determining the intervals of the surface-treatment trenches. While heeding all tolerances, the distances of the individual surface-treatment steps from each other should rather be selected to be larger from the viewpoint of process safety. The areas of surface treatment and filling of these trenches contribute not merely to generation of charge carriers. Thus with the prior art, valuable active solar cell surfaces are squandered during generation of charge carriers and thus the power efficiency of the solar cell is lessened.

It is the task of the invention to configure the surface treatment so that for one thing, the processes are simplified and thus become less expensive, and for another, short circuits at the connection points of individual segments are avoided (Aspect A). Further it is the task of the invention to reduce the inactive solar cell surface to a minimum by joining the inactive segments, thus increasing the power efficiency of the solar cell (Aspect B).

Aspect A

The problem is solved according to the invention so that in surface-treatment step A, not only the transparent front contact layer, but rather all the layers lying above the metallic back contact layer are penetrated (see FIG. 4). Thus, surface-treatment steps A and B are technologically identical, by which now one and the same sets of parameters or the same technology in surface treatment can be used for A and B. By this means, the danger of a short circuit of two adjoining segments via the absorber layer (3) is avoided. The individual solar cell segments are connected in known fashion by use of an electrically conducting polymeric paste in the surface treated trench B, while in contrast the surface-treated trenches A and C are filled with an electrically insulating polymeric paste.

Aspect B

For minimizing the inactive surface of the solar cell, an alteration in the processing sequence is proposed according to the invention. Surface treatment A is carried out only after the filling of the trenches surface-treated with B and C. Thus, for example, while using a camera system, the contour of the conducting polymeric paste filled in trench B is detected. By this means, surface treatment A can be applied to any thickness on the edge of the electrically conducting polymeric paste. It no longer is necessary to fill surface-treated trench A with an electrically insulating paste. Thus, with the way named in aspect B, the share of inactive surface is minimized, and also, there is a savings of electrically insulating polymeric paste (see FIG. 5 top).

DRAWINGS

The drawings described herein are for illustrative purposes only of selected embodiments and not all possible implementations, and are not intended to limit the scope of the present disclosure.

FIG. 1 illustrates an example of a basic structure of a thin-layer solar cell according to the present disclosure;

FIG. 2 illustrates an alternative example of a basic structure of a thin-layer solar cell according to the present disclosure;

FIG. 3 illustrates an example process for applying electrically conducting paste or electrically insulating paste to a thin-layer solar cell according to the present disclosure;

FIG. 4 illustrates an example of a thin-layer solar cell including a structure of a joint according to the present disclosure;

FIG. 5 illustrates an alternative example of a thin-layer solar cell including a structure of a joint according to the present disclosure;

FIG. 6 illustrates an example process for surface treatment of a thin-layer solar cell (Aspect A) according to the present disclosure;

FIG. 7 illustrates an alternative example process for surface treatment of a thin-layer solar cell (Aspect A) according to the present disclosure; and FIG. 8 illustrates an alternative example process for surface treatment of a thin-layer solar cell (Aspect B) according to the present disclosure.

FIG. 9 illustrates an example of a process sequence for Aspect A.

FIG. 10 illustrates an alternative to the invention-specific connection.

FIG. 11 illustrates an alternative to the invention-specific structure by additional application of electrically conducting contact fingers.

Corresponding reference numerals indicate corresponding parts throughout the several views of the drawings.

DETAILED DESCRIPTION

Processing sequence for the invention-specific serial connection

Aspect A

The point of departure is a substrate coated with the individual layers necessary for a thin-layer solar cell (see FIG. 1 and FIG. 6 (a)). The layers on the substrate are then surface-treated. The layers are subdivided into individual segments. Three surface treatments (A, B, C) are necessary per individual segment (see FIG. 6 (b)). With this, surface treatments A and B fully separate layers 3,4 and 5, so that layer 2 becomes visible. Surface treatment C fully separates layers 2, 3, 4 and 5, so that the substrate (1) becomes visible. The layers can be divided mechanically with a scriber, for example. What counts here are to find the optimal parameters for removal of the individual layers. Thus for example, the power of the scriber, the traversing speed of the scriber, the radius of the scriber tip or the number of scriber passes can be adjusted. The parameters for surface treatments A and B are to be chosen so that damage to layer 2 is avoided, but nonetheless complete removal of layers 3, 4 and 5 is ensured. The parameters of surface treatment C are to be so chosen that a complete splitting up of layer 2 is ensured without impairing the function of the substrate (1). Ideally with surface treatment C, the substrate is not to be superficially removed. True, a superficial removal of the substrate is not problematical as long as the stability of the substrate is not affected. Trenches A, B and C can be opened up according to the invention while using a laser beam or through the combination of lithography and wet chemical etching or vacuum-based dry etching techniques. The distances of the 3 surface treatments of a segment from each other are in essence determined by the positional precision in filling the surface-treated trenches and the guiding of the electrically conducting and electrically insulating polymeric pastes, and should be optimized in regard to minimizing solar-inactive surfaces.

Following the surface treatments A to C, the generated trenches are to be filled with electrically insulating polymeric paste (trenches A and C) and electrically conducting polymeric paste (trench B). For filling the trenches, a dispenser either with a pressure-loaded cartridge or a dispenser with a spindle valve or a dispenser with a jet valve can be used, with the last-named system ensuring higher throughputs in the context of mass production. However, according to the invention, screen printing technology or technologies related in type can be used. The electrically insulating polymeric paste fills trenches A and C (see FIG. 6 (c)). Trenches A and C are filled so that no electrically insulating polymeric paste gets into trench B. In addition, trenches A and C must be completely filled, with no parts of the trenches remaining unfilled.

Then the electrically conducting paste must be applied in trench B and out beyond trench C (see FIG. 6 (d)). The polymeric pastes filled into the trenches must be dried after application in accordance with the instructions of the manufacturer. Depending on the polymer system of the pastes, this can be done in a return air drying oven or under UV irradiation. Thus, an electrical connection is created between the rear contact layer of one segment and the front contact layer of the adjoining segment (see FIG. 6 (d)). The electrically conducting polymeric paste must not extend out far enough over the non-conducting filling of trench C that electrical contact to the transparent front contact layer is possible. How large at the end the surface is, which touches the transparent front contact, depends on the type of the transparent front contact and the conducting polymeric paste. Here an optimization must be carried out in regard to electrical losses and shadowing of active cell surfaces.

Example for Aspect A

The example is described using FIG. 7.

Application of the process sequence to fabricate a 5 cm×5 cm unit of thin-layer solar cells connected among each other. It should be mentioned that the size of the connected thin-layer solar cells is an example: according to the invention, any sizes can be used.

The point of departure is a 15-75-μm-thick polyimide foil as the substrate (1). This is coated by molybdenum over the entire surface to about 0.2 to 2 μm thick, as an example, by means of magnetron sputtering. This molybdenum layer serves as the back contact layer (2) of the solar cell. However, other metals or metallic layers could serve as back contact layers. Then onto this molybdenum layer, the elements copper, indium, gallium and selenium are deposited by means of Kover damping in vacuum. However, other known technologies for depositing the CIGS layer can be used. Among these are sequential deposition, galvanic deposition, printing technologies, or ion-beam-supported deposition. Onto this roughly 1 to 2 μm thick Cu (In,Ga) $Se_2$-layer (absorber layer, photoactive layer (3)), a thin (10 to 100 nm) cadmium sulfide layer is then applied by the wet chemical method. The CdS layer can also be furnished by a vacuum-based technology. It is also within the invention to use possible Cd-free buffer layers. On the buffer layer follows a thin (10 to 100 nm) intrinsic zinc oxide layer (i-ZnO), applied by means of RF sputtering (4). To conclude, then a roughly 0.5 to 3 μm thick zinc oxide layer (Al:ZnO) doped with aluminum is sputtered on. The i-ZnO layer and the Al:ZnO layer are, for simplification, shown as the front contact layer (5). The Al:ZnO layer can also consist of ITO. The individual layers can also be furnished in an batch process and in a continuous process (for example roll-to-roll).

The polyimide band provided with the above-named coatings is dressed to a size of 5 cm×5 cm and is now the point of departure for the surface treatment of the layers and the series connection to follow (see FIG. 7 (a)).

The 5 cm×5 cm coated polyimide foil is equipped with 18 parallel surface treatments as shown in FIG. 7 (b), with every three surface treatments arranged in groups. The sequence of the surface treatment lines (see FIG. 7 (b)) is ABCABC . . . etc. The surface treatment A is the start. This is carried out for example mechanically using a scriber. The scriber itself is secured to an x-y-z table and is guided with computer support. Depending on the material properties of layers 3, 4 and 5, the processing parameters of the scriber (such as radius of the scriber, application force of the scriber, passage speed of the tip and number of passes of the tip) are so adapted that layers 3, 4 and 5 are completely removed along the surface-treatment line without thereby destroying layer 2. In this case the length of the surface-treatment line is 5 cm (length of the coated substrate). The width of the line is in essence determined by the radius of the scriber tip. In the example, the line width was 70 μm; other typical line widths were about 10 to 100 μm. After the first surface treatment A is completed, surface treatment B occurs. This lies parallel to surface treatment A, displaced by about 300 μm. However, the displacement can so be 50-500 μm. Since surface treatments A and B are identical, surface treatment B is done according to the scheme of surface treatment A. After surface treatment B is concluded, surface treatment C occurs. This is done parallel to surface treatment B, displaced by 300 μm. But the displacement can also be 50-500 μm.

In the example depicted, surface treatment C is carried out by means of a scriber. Varying from surface treatments A and B, the parameters were so adapted that in addition to layers 3, 4 and 5, layer 2 was also separated.

If surface-treatment step C is complete, then the surface-treatment steps A, B and C just described are repeated, with this next grouping of surface treatments being displaced parallel to the first group by about 7 mm, for example. The third surface-treatment group is then displaced relative to the second group by 7 mm and so on. Overall, 6 groups, each with 3 surface-treatment lines are placed (see FIG. 7 (b)). It should be mentioned that the interval between surface-treatment groups can be between 3 and 15 mm, and depends, among other things, on the electrical properties of the front contact. Likewise, first all of the surface-treatment steps for the trenches A can be carried out on the 5-cm substrate, and thereafter the surface-treatment steps B and C, or in any other sequence desired.

After the completion of all the surface-treatment lines, the trenches created are filled. First trenches A and C are filled with an electrically insulating polymeric paste with the aid of a computer-controlled dispenser on an x-y-z table (see FIG. 7

(c)). They are filled so that no electrically insulating paste runs into trench B and closes it. In addition, trenches A and C must be filled with electrically insulating paste with no gaps. This is of especially decisive importance for trench C, because it then is covered by an electrically conducting paste, which for its part then can penetrate into it if trench C is not completely insulated, and can thus lead to a short circuit of two segments. Electrically insulated polymeric pastes can be obtained commercially from various manufacturers. The line thickness of the applied paste is dependent on the flow characteristics of the paste. Also, the line thickness can be influenced by the parameters of the dispenser (pressure applied to the cartridge; application rate; diameter of the outlet opening of the cartridge, etc.). Typical line widths are in a range from 1500 to 300 µm. The trenches are to be filled over the entire trench length (in this case 5 cm). After all the trenches A and C have been filled with electrically insulating paste, the paste must be hardened according to manufacturer specifications by means of a return-air drying oven or by IR or UV radiation.

After the insulating paste has dried, then all the trenches B can be filled with electrically conducting paste with the aid of a dispenser (see FIG. 7 (d)). Here also the line thickness of the applied paste is dependent on the flow characteristics of the paste. Also, the line thickness can be influenced by the parameters of the dispenser (pressure applied to the cartridge; application rate; diameter of the outlet opening of the cartridge, etc.). The electrically conducting paste must be applied so that trench B is completely filled, without running out over the insulated filling of trench A, since otherwise the segment will short-circuit. Additionally, the electrically conducting paste in every case must be directed over the insulated filling of trench C, thus guaranteeing contact with the front contact layer of the following segment. Typical line widths of the electrically conducting fillings are 400 to 700 µm, and among other things depend on the interval of trenches B and C. Electrically insulated polymeric pastes can be obtained commercially from various manufacturers. After all the trenches B have been filled with electrically insulating paste, the paste must be hardened according to manufacturer specifications in a return-air drying oven or with IR or UV radiation.

Aspect B

Varying from the process sequence in Aspect A, first in the layer package (see FIG. 8 (a)) only surface treatments B and C are carried out (see FIG. 8 (b)). Then trench C is filled with electrically insulating paste (see FIG. 8 (c)). The insulating paste is dried in accordance with manufacturer's specifications. Then, the electrically conducting polymeric paste in trenches B and over the filling of trench C outward is filled with an electrically conducting polymeric paste (see FIG. 8 (d)). Then the surface treatment A is carried out (see FIG. 8 (e)). For minimizing solar-inactive surfaces, it is advantageous to set the surface treatment A as much as possible on the edge of the filling of electrically conducting polymeric paste. This can be attained by detecting the edge of the filling of electrically conducting paste with the aid, for example, of an optical recognition device (camera) (see FIG. 5 and the comparison to prior art in FIG. 5 bottom). What is decisive here is that surface treatment A occurs only after the filling of trenches B and C. Since an electrically conducting polymeric paste attains its conductivity mainly by addition of metal particles, through reflection of light on these particles a good contrast is produced to solar cell material, since it in fact absorbs the light. In accordance with the position and the molding out of the edge of the filling of electrically conducting paste, thus the surface treatment A can for one thing be set as tightly as possible on the edge. For another, the surface treatment A can be adapted to the molding out of the edges of the filling of electrically conducting paste. Both of the last-named possibilities can minimize the size of inactive surfaces and thus increase the effectiveness of the solar cells. Additionally, one processing step (filling trench A with electrically insulating paste) can be saved, thus lowering production costs.

Example for Aspect B

The example is described using FIG. 9.

Application of the processing sequence to assemble a 5 cm×5 cm unit as an example from thin-layer solar cells connected to each other.

The point of departure is the layer deposition and layer production explained in the specification example for Aspect A.

The polyimide band provided with the above-named coatings is trimmed for example to a size of 5 cm×5 cm and is now the point of departure for surface treatment of the layers and the series connection that follows. The 5 cm×5 cm coated polyimide foil, is, as shown in FIG. 9 (b), first provided with 12 parallel surface treatments, with every two surface treatments arranged in groups. The sequence of the surface-treatment lines (see FIG. 9 (b)) is BCBC . . . etc. The surface treatment B is the start. This is carried out for example mechanically using a scriber. The scriber itself is secured to an x-y-z table and is guided with computer support. Depending on the material properties of layers 3, 4 and 5, the processing parameters of the scriber (such as radius of the scriber, application force of the scriber, passage speed of the tip and number of passes of the tip) are so adapted that layers 3, 4 and 5 are completely removed along the surface-treatment line without thereby destroying layer 2. In this case the length of the surface-treatment line is 5 cm (length of the coated substrate). The width of the line is in essence determined by the radius of the scriber tip. In the example, the line width was 70 µm; other typical line widths are about 10 to 100 µm.

After the first surface treatment B is completed, surface treatment C occurs. This lies parallel to surface treatment B, displaced by 300 µm. However, the displacement can be 50-500 µm. Surface treatment C is carried out for example by means of a scriber. Varying from surface treatment B, the parameters were so adapted that in addition to layers 3, 4 and 5, layer 2 was also separated.

If surface-treatment step C is complete, then the surface-treatment steps B and C just described are repeated, with this next grouping of surface treatments being displaced parallel to the first group by about 7.5 mm. The third surface-treatment group is then displaced relative to the second group by 7 mm and so on. Overall, 6 groups, each with 2 surface-treatment lines are placed (see FIG. 9 (b)). It should be mentioned that the interval between surface-treatment groups can be between 3 and 15 mm, and depends, among other things, on the electrical properties of the front contact and the interval as well as the width of trenches B and C. Likewise, first all of the surface-treatment steps for trench B can be carried out on the 5-cm substrate, and thereafter surface-treatment step C, or in any other sequence desired.

After the conclusion of all the surface-treatment lines, the trenches created are filled.

First the trenches C are filled with an electrically insulating polymeric paste with the aid of a computer-controlled dispenser on an x-y-z table (see FIG. 9 (c)). They are to be filled so that no electrically insulating paste runs into trench B and closes it. In addition, trench C must be filled with electrically insulating paste with no gaps. This is of especial decisive importance for trench C, because it then is covered by an electrically conducting paste, which for its part then can penetrate into it if trench C is not completely insulated, and can thus lead to a short circuit of two segments. Electrically insulated polymeric pastes can be obtained commercially from various manufacturers. The line thickness of the applied paste is dependent on the flow characteristics of the paste. Also, the line thickness can be influenced by the parameters of the dispenser (pressure applied to the cartridge; application rate; diameter of the outlet opening of the cartridge, etc.). Typical line widths are in a range from 1500 to 300 µm. The trenches are to be filled over the entire trench length (in this case 5 cm). After the trenches C have been filled with electrically insulating paste, the paste must be hardened according to manufacturer specifications by means of a return-air drying oven or by IR or UV radiation.

After the insulating paste has dried, then all the trenches B can be filled with electrically conducting paste with the aid of a dispenser (see FIG. 9 (d)). Here also the line thickness of the applied paste is dependent on the flow characteristics of the paste. Also, the line thickness can be influenced by the parameters of the dispenser (pressure applied to the cartridge; application rate; diameter of the outlet opening of the cartridge, etc.). The electrically conducting paste must in every case must be directed over the insulated filling of trench C, thus guaranteeing contact with the front contact layer of the following segment. Typical line widths of the electrically conducting fillings are 400 to 700 µm, and among other things depend on the interval of trenches B and C. Electrically insulated polymeric pastes can be obtained commercially from various manufacturers. After all the trenches B have been filled with electrically insulating paste, the paste is hardened according to manufacturer specifications in a return-air drying oven or with IR or UV radiation.

If the electrically conducting paste has hardened, surface treatment A can take place. Surface treatment A is set on the left (FIG. 9 (e)) by the filling of trench B. Surface treatment A is carried out for example mechanically with the aid of a scriber. Surface treatment A should for one thing extend as tightly as possible to the filling of trench B. For another, it is advantageous to adapt the course of surface treatment A to the contours of the filling of trench B. For this it is necessary to detect and evaluate the contours of the filling of trench B. This can be implemented with the aid of a camera system which also is attached to an x-y-z table along with optical evaluation. If the data on the contour of the filling are present, then the progression of the scriber for surface treatment A can be adjusted so that the optical losses (through detachment of solar-active surfaces) are minimized.

Variation on the Invention-Specific Process Sequence

All of the surface treatments can also be done using lasers or by photolithography in combination with an etching technology (wet chemical or vacuum-based dry etching method). A combination of all of those methods named is also possible.

Generally layer packages that are on both rigid and flexible substrates can be connected with the invention-specific method. The substrate can be electrically insulating or electrically conducting.

In the case of an electrically conducting substrate, such as a metal foil, an electrically insulating layer must be placed on this substrate, i.e., between the substrate (1) and the back contact layer (2), to avoid a short circuit of the individual segments via their back contact layers, which would lead to a considerable impairment of the function of the later connection. The parameters of surface treatment C can here be chosen so that the electrically insulating layer can be removed or remains on the substrate; what is decisive is that the back contact layer is completely separated.

Filling of trenches A and C with electrically insulating polymeric paste can also be replaced by coating with an electrically insulating material such as SiOx, by means of vacuum separation or galvanic separation.

Filling of trench B with electrically conducting polymeric paste can also be replaced by an electrically conducting material like silver by means of vacuum separation or galvanic separation.

Generally it is also possible, for filling trenches A, B and C, to combine the methods for applying a polymeric paste with the methods of vacuum separation and galvanic separation.

The surface treatment steps A, B and C can in principle be so tight that between the surface-treated trenches that no more layer packages are present (see FIG. 10 (i)). In this invention-specific version, the surface-treatment step for the trench A and the trench B are replaced by a single surface-treatment step. Along with reduction of manufacturing costs, this also has an advantage in that the inactive surface of the solar cell is reduced, and thus the efficiency of the solar cell is increased.

Here it is also possible to delete an additional production step for fillings with electrically insulating polymeric paste (see FIG. 10 (ii), similar to FIG. 5). However, only 2 of the trenches can be placed so tightly that no stacks of layers remain between the lines (see FIG. 10 (iii)).

Apart from with a dispenser, the trenches can also be filled with electrically insulating and electrically conducting paste by means of serigraphy, screen printing, ink-jet or spray methods (using masks). Generally a combination of the individual methods named is also conceivable.

Along with electrically insulating and electrically conducting pastes based on polymers, paste systems based on silicon or acrylate can also be used.

In addition to filling the surface treatment B with electrically conducting polymeric paste, these can for example be further applied in the form of individual contact fingers onto the active solar cell surface, thus supporting the conductivity of the front contact layer, through which the intervals of the individual segments from each other can be increased, and thus after an optimization of serial resistance losses and shadowings of solar-active surfaces, a maximum of solar-active surface can be achieved (see FIG. 11).

In principle the invention-specific method can be applied to every type of thin-layer solar cell on a flexible substrate. The following types serve as examples:
Copper indium gallium diselenide, copper indium diselenide, copper gallium diselenide (or selenium substituted for by sulfur)
amorphous silicon
cadmium telluride
microcrystalline silicon
gallium arsenide

LEGEND FOR THE FIGURES

1 Substrate, carrier
2 Back contact; metallic layer, for example
3 Photoactive layer, absorber layer
4 Buffer layers
5 Tunnel contact and transparent front side electrode: for example, electrically conducting oxide
6 electrically insulating layer: for example, electrically insulating polymeric paste
7 electrically conducting layer: for example, polymeric paste filled with metal particles
8 contact fingers

The invention claimed is:

1. A method of making a serial connection of thin-layer solar cells, the solar cells comprising a substrate, a back contact layer, an absorber layer, a buffer layer, and a transparent front contact layer, the method comprising inserting trenches into the solar cells and producing an electrical contact,
   wherein each solar cell is subdivided by three trenches A, B, C to create a plurality of adjacent cell segments, wherein trenches A and B extend down to the back contact layer, trench C extends down to the substrate,
   wherein trench C is are filled with electrically insulating paste, trench B is to be filled with electrically conducting paste, the electrically conducting paste also covering trench C, and the adjacent cell segments are electrically connected, and wherein trench A is created thereafter and filled with electrically insulating paste.

2. The method of making a serial connection of thin-layer solar cells according to claim 1, wherein for surface treatment of the layer package of the thin-layer solar cell relative to trenches A and B, the same sets of parameters are used.

3. The method of making a serial connection of thin-layer solar cells according to claim 1, wherein the surface treatment is done with a scriber, with laser beams or with photolithography.

4. The method of making a serial connection of thin-layer solar cells according to claim 1, wherein paste systems based on polymers or based on silicon or acrylate are used.

5. The method of making a serial connection of thin-layer solar cells according to claim 1, wherein for filling the trenches created the electrically insulating paste, a dispenser with a pressure-loaded cartridge or with a spindle valve or with a jet valve is used.

6. The method of making a serial connection of thin-layer solar cells according to claim 1, wherein the trenches are filled by dispenser, screen printing, ink-jet or spray methods while using a mask.

7. The method of making a serial connection of thin-layer solar cells according to claim 1, wherein the isolation of a trench is achieved by vacuum deposition or galvanic separation deposition of an electrically insulating material.

8. The method of making a serial connection of thin-layer solar cells according to claim 1, wherein the methods for application of an insulating layer in the two trenches to be filled can be combined by treating trench A with paste application using a dispenser, and trench C by SiOx by means of vacuum deposition.

9. The method of making a serial connection of thin-layer solar cells according to claim 1, wherein the electrical connection in trenches which join the back contact layer of one segment with the front contact layer of a following segment is attained by vacuum deposition or galvanic separation deposition of an electrically conducting material.

10. The method of making a serial connection of thin-layer solar cells according to claim 1, wherein an electrically conducting polymeric paste extends out far enough beyond the non-conducting filling of trench C that electrical contact with the front contact layer is possible.

11. The method of making a serial connection of thin-layer solar cells according to claim 10, wherein the electrically conducting polymeric paste is applied as contact fingers on the active solar cell surface.

12. A method of making a serial connection of thin-layer solar cells, the solar cells comprising a substrate, a back contact layer, an absorber layer, a buffer layer, and a transparent front contact layer, the method comprising inserting trenches in the solar cells and producing an electrical contact,
   wherein each solar cell is subdivided by three trenches A, B, C to create a plurality of adjacent cell segments, wherein trench B extends to the back contact and trench C extends to the substrate,
   wherein trench C is filled with an electrically insulating paste, trench B is filled with an electrically conducting paste, the electrically conducting paste also covering trench C, and
   wherein trench A is created thereafter.

13. A method of making a serial connection of thin-layer solar cells, the solar cells comprising a substrate, a back contact layer, an absorber layer, a buffer layer, and a transparent front contact layer, the method comprising inserting trenches in the solar cells and producing an electrical contact,
   wherein each solar cell is subdivided by two trenches B, C to create a plurality of adjacent cell segments,
   wherein trench B extends to the back contact and trench C extends to the substrate,
   wherein trench C is filled with an electrically insulating paste, trench B is filled with an electrically conducting paste, the electrically conducting paste also covering trench C, wherein subsequently a trench A is made through the layer package down to the back contact.

* * * * *

UNITED STATES PATENT AND TRADEMARK OFFICE
CERTIFICATE OF CORRECTION

PATENT NO.       : 8,778,723 B2  
APPLICATION NO.  : 13/496779  
DATED            : July 15, 2014  
INVENTOR(S)      : Karsten Otte et al.

Page 1 of 1

It is certified that error appears in the above-identified patent and that said Letters Patent is hereby corrected as shown below:

In the Claims  
In Col. 11, Line 12, Claim 1, after "is", delete "are".  
In Col. 11, Line 13, Claim 1, after "is", delete "to be".

Signed and Sealed this  
Fourth Day of November, 2014

Michelle K. Lee  
*Deputy Director of the United States Patent and Trademark Office*